US010101727B2

(12) United States Patent
Suzuki et al.

(10) Patent No.: US 10,101,727 B2
(45) Date of Patent: Oct. 16, 2018

(54) COMMON PARAMETER INTERFACE GENERATION PROGRAM AND PARAMETER READING PROGRAM

(71) Applicant: Mitsubishi Electric Corporation, Tokyo (JP)

(72) Inventors: Kazuhisa Suzuki, Tokyo (JP); Satoshi Iwatsu, Tokyo (JP); Takayuki Yamaoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 206 days.

(21) Appl. No.: 14/907,853

(22) PCT Filed: Jul. 14, 2014

(86) PCT No.: PCT/JP2014/068710
§ 371 (c)(1),
(2) Date: Jan. 27, 2016

(87) PCT Pub. No.: WO2016/009474
PCT Pub. Date: Jan. 21, 2016

(65) Prior Publication Data
US 2016/0179084 A1 Jun. 23, 2016

(51) Int. Cl.
*G05B 19/4099* (2006.01)
*G06F 17/50* (2006.01)
*G05B 19/408* (2006.01)

(52) U.S. Cl.
CPC ....... *G05B 19/4099* (2013.01); *G05B 19/408* (2013.01); *G06F 17/50* (2013.01);
(Continued)

(58) Field of Classification Search
CPC .............. G05B 19/4099; G05B 19/408; G05B 2219/36284; G05B 2219/35134; G06F 17/50
See application file for complete search history.

(56) References Cited

U.S. PATENT DOCUMENTS 6,775,585 B2 * 8/2004 Bedont, Jr. ............. G06F 17/50
700/159
7,123,986 B2 * 10/2006 Lukis .................. B29C 33/3835
700/197
(Continued)

FOREIGN PATENT DOCUMENTS

JP 7-103400 A 4/1995
JP 8-272844 A 10/1996
(Continued)

OTHER PUBLICATIONS

Communication dated Jun. 2, 2016, issued by the Taiwan Patent Office in corresponding Taiwanese Application No. 104110207.
(Continued)

*Primary Examiner* — Charles Kasenge
(74) *Attorney, Agent, or Firm* — Sughrue Mion, PLLC; Richard C. Turner

(57) ABSTRACT

A common parameter interface generation program being configured to cause a processor to execute a method, including: assigning identification information for identifying a control device, acquiring a list of parameters of a selected control device from a design information storage unit, associating the acquired list with the identification information and the names of the selected control device in each of the design information to generate a common parameter and of registering the common parameter in a common parameter storage unit, and generating, in each of design tools, a common parameter interface that acquires the value of the parameter of the control device from the common parameter storage unit and reads out the value to the design information in a data format in data format definition information which defines the data format required when the parameter is treated in the design tools.

10 Claims, 15 Drawing Sheets

(52) U.S. Cl.
CPC ........... *G05B 2219/35134* (2013.01); *G05B 2219/36284* (2013.01); *Y02P 90/265* (2015.11)

(56) References Cited

U.S. PATENT DOCUMENTS

| | | | |
|---|---|---|---|
| 8,127,060 B2* | 2/2012 | Doll | G05B 19/042 700/86 |
| 8,229,579 B2* | 7/2012 | Eldridge | G05B 15/02 700/31 |
| 8,643,676 B2 | 2/2014 | Matsui | |
| 2002/0065849 A1* | 5/2002 | Ferguson | H04L 29/06 715/205 |
| 2004/0068342 A1* | 4/2004 | Bedont, Jr. | G06F 17/50 700/182 |
| 2006/0161410 A1 | 7/2006 | Hamatani et al. | |
| 2006/0200270 A1* | 9/2006 | Lukis | B29C 33/3835 700/197 |
| 2006/0282248 A1 | 12/2006 | Kageyama et al. | |
| 2007/0055388 A1* | 3/2007 | Araki | G05B 19/052 700/18 |
| 2009/0254197 A1* | 10/2009 | McLaughlin | G05B 19/4186 700/2 |
| 2010/0305720 A1* | 12/2010 | Doll | G05B 19/042 700/86 |
| 2015/0193557 A1* | 7/2015 | Okuno | G06F 17/5009 703/1 |
| 2015/0362916 A1* | 12/2015 | Mansouri | G05B 19/4188 700/19 |
| 2015/0363543 A1* | 12/2015 | Mansouri | G06Q 10/0637 703/7 |
| 2015/0365492 A1* | 12/2015 | Kalan | G06Q 10/0637 700/83 |

FOREIGN PATENT DOCUMENTS

| | | |
|---|---|---|
| JP | 10-283392 A | 10/1998 |
| JP | 2003-44529 A | 2/2003 |
| JP | 2003-108220 A | 4/2003 |
| JP | 2006-195971 A | 7/2006 |
| JP | 2006-350549 A | 12/2006 |
| JP | 2011-107962 A | 6/2011 |
| JP | 5403974 B2 | 1/2014 |

OTHER PUBLICATIONS

International Search Report of PCT/JP2014/068710 dated Sep. 30, 2014.
Japanese Office Action of JP Application No. 2015-526425 dated Jul. 28, 2015.
Japanese Notice of Allowance of JP Application No. 2015-526425 dated Dec. 1, 2015.

* cited by examiner

FIG.4(a)
(a)
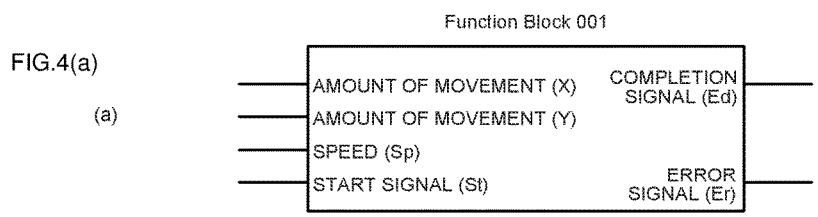
FIG.4(b)
(b)
| ID | NAME IN LINE DESIGN | NAME IN MECHANICAL DESIGN | NAME IN CONTROL DESIGN | PARAMETER NAME | VALUE |
|---|---|---|---|---|---|
| 0001 | △△ ARM | △△ OPERATION TIMING | Function Block 001 | X | 0 |
| | | | | Y | 0 |
| | | | | Sp | 0 |
| | | | | St | 0 |
| | | | | Ed | 0 |
| | | | | Er | 0 |
| | | | | | |
| | | | | | |
| | | | | | |
FIG.5
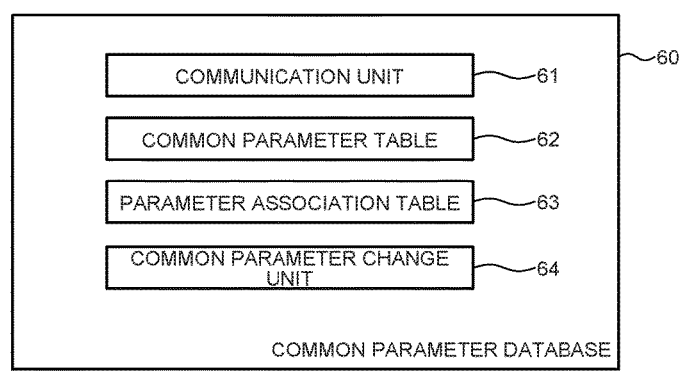

FIG.12
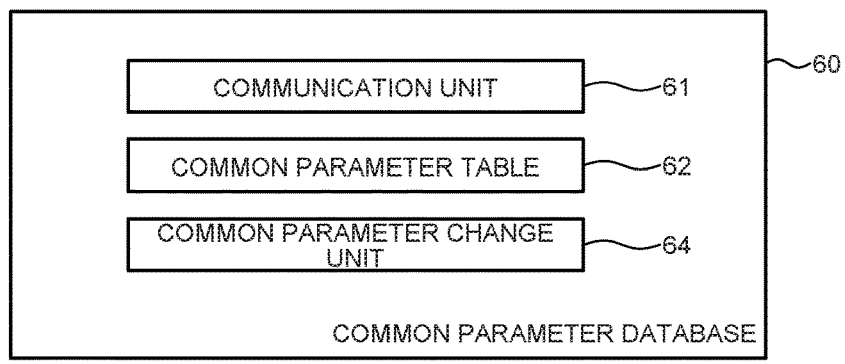
FIG.13
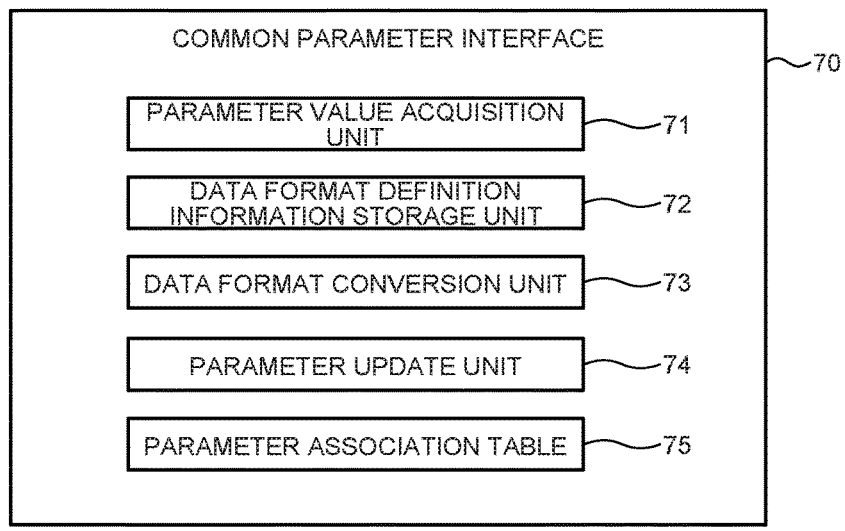
FIG.14
| ID | PARAMETER NAME | USER-DEFINED PARAMETER NAME |
|---|---|---|
| 0001 | X | D100 |
| 0001 | Y | D101 |
| 0001 | Sp | D102 |
| 0001 | St | M200 |
| 0001 | Ed | M300 |
| 0001 | Er | D1000 |

FIG. 16

| ID | NAME IN LINE DESIGN | NAME IN MECHANICAL DESIGN | NAME IN CONTROL DESIGN | PARAMETER NAME | DATA FORMAT | VALUE | VALID STATE | UPDATE NECESSARY/UNNECESSARY STATE |
|---|---|---|---|---|---|---|---|---|
| 0001 | △△ ARM | △△ OPERATION TIMING | Function Block 001 | X | Int, 16bit | 0 | VALID | UPDATE UNNECESSARY |
| | | | | Y | Int, 16bit | 0 | VALID | UPDATE UNNECESSARY |
| | | | | Sp | Int, 16bit | 0 | VALID | UPDATE UNNECESSARY |
| | | | | St | 1bit | 0 | INVALID | UPDATE UNNECESSARY |
| | | | | Ed | 1bit | 0 | VALID | UPDATE NECESSARY |
| | | | | Er | Int, 16bit | 0 | VALID | UPDATE UNNECESSARY |

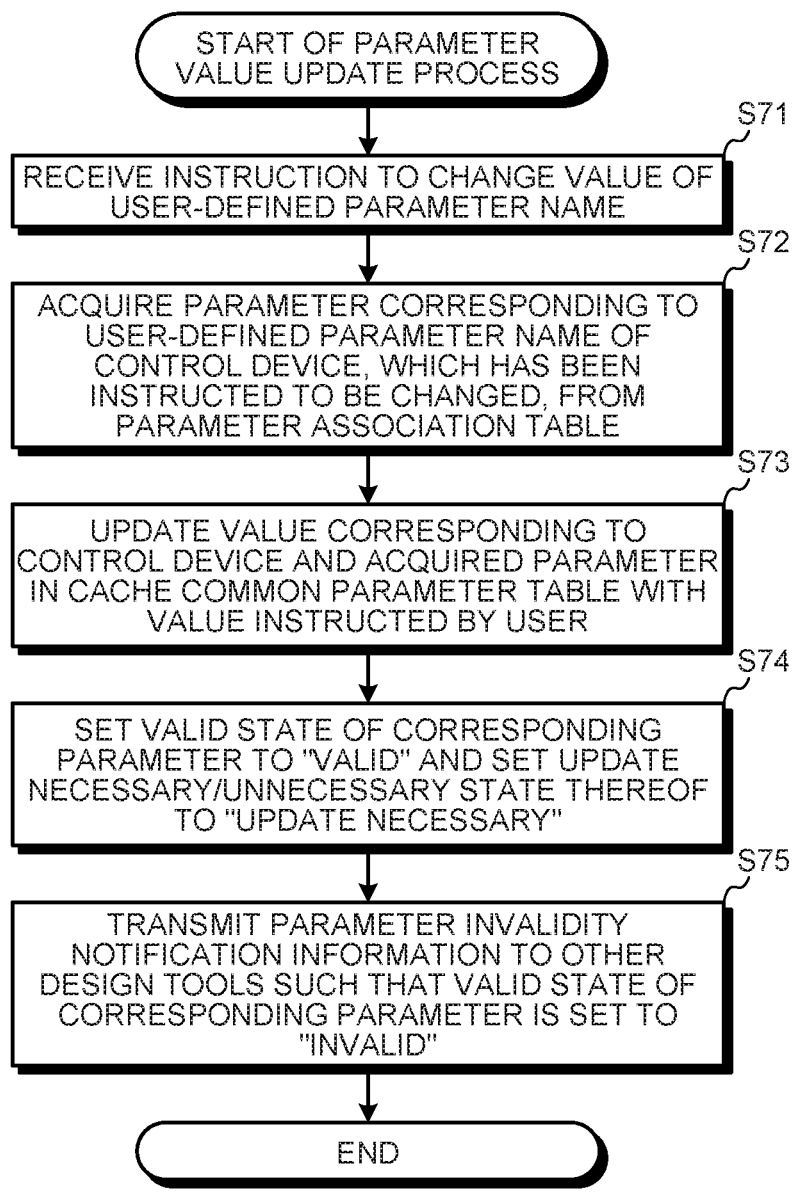

COMMON PARAMETER INTERFACE GENERATION PROGRAM AND PARAMETER READING PROGRAM

CROSS REFERENCE TO RELATED APPLICATIONS

This application is a National Stage of International Application No. PCT/JP2014/068710 filed Jul. 14, 2014, the contents of all of which is incorporated herein by reference in its entirety.

FIELD

The present invention relates to a common parameter interface generation program and a parameter reading program.

BACKGROUND

In the conventional line design, different persons perform the line design, the mechanical design, and the control design in this order. In the line design, a factory automation (FA) apparatus is arranged and line design information is generated. In the mechanical design, an FA apparatus which satisfies the required performance and specifications is selected on the basis of the line design information and mechanical design information, such as a timing chart, is generated. In the control design, a programming language or a program component is selected on the basis of the mechanical design information and a control program is created.

When the specifications or design is changed during the line design in a broad sense, the content of the change is transmitted between the persons in charge and needs to be reflected in the line design information, the mechanical design information, and the control program.

However, in the related art, an integrated simulation system which includes a plurality of independent simulators and a cooperation unit has been proposed. In the system, the plurality of independent simulators simulate a plurality of elements forming a simulation target, and a cooperation unit has a common data area to which the plurality of simulators are accessibly connected and includes a time management unit for, when a synchronization request is received from a simulator, managing a simulation time with the other simulators (for example, see Patent Literature 1). For example, the simulation result of each simulator or the state of each simulator is stored in the common data area. In addition, the integrated simulation system includes a change unit for detecting an area which accesses an external device in the program and changing the access destination to an address in the common data area, when each simulator performs a simulation.

CITATION LIST

Patent Literature

Patent Literature 1: Japanese Patent Application Laid-Open No. 2006-350549

SUMMARY

Technical Problem

The line design information, the mechanical design information, and the control program include parameters which have the same meaning but have different data formats. When the parameters are changed in any one of the line design information, the mechanical design information, and the control program, the persons in charge of the respective design information change the parameters in different formats which are included in the other design information. In a small-scale line design, the person in charge can modify the design. However, in a large-scale line design, for example, a modification error may occur.

The change unit of the integrated simulation system disclosed in Patent Literature 1 changes the access destination in the program to an address in the common data area. However, Patent Literature 1 does not disclose a technique which changes the parameters that have the same meaning but have different formats in each design information item.

The present invention has been made in view of the above-mentioned problems and an object of the present invention is to provide a common parameter interface generation program and a parameter reading program which can reflect a change in corresponding parameters in all design information items when each design information item is generated in a plurality of design processes forming a control system and parameters that are used in each process, have the same meaning, and have different data formats are changed.

Solution to Problem

In order to attain the above object, in a common parameter interface generation program that generates a common parameter interface in a line design tool which generates line design information of a control system having models of control devices arranged therein, a mechanical design tool which selects a control device on the basis of the line design information and generates mechanical design information, and a control design tool which generates control design information of a mechanical operation on the basis of the mechanical design information, the common parameter interface generation program of the present invention being configured to cause a computer to perform: an identification information assigning step of assigning identification information for identifying the control device in the acquired line design information; a parameter acquisition step of acquiring a list of parameters of the selected control device, which are used in the mechanical design information and the control design information, from a design information storage unit; a common parameter generation step of associating the acquired list of the parameters with the identification information and the names of the selected control device in each of the design information to generate a common parameter and of registering the common parameter in a common parameter storage unit that stores a parameter used in common by the line design tool, the mechanical design tool and the control design tool; and a common parameter interface generation step of generating, in each of the design tools, a common parameter interface that acquires the value of the parameter of the control device from the common parameter storage unit when the design information is read and reads out the value of the parameter to the design information in a data format in data format definition information which defines the data format required when the parameter is treated in the line design tool, the mechanical design tool, and the control design tool.

Advantageous Effects of Invention

According to the present invention, the common parameter interface, generated for each design tool, acquires the value of the parameter of the control device from the common parameter storage unit when the design information is read and reads out the value of the parameter to the design information in a data format in the data format definition information for defining the data format required when the parameter is treated in the design tools. Therefore, when the value of the parameter is changed in any one of the design tools and the design information is read in the design tool, it is possible to acquire the value of the latest parameter from the common parameter storage unit and to read the value of the parameter in the format defined in each design tool.

BRIEF DESCRIPTION OF DRAWINGS

FIG. 4(a) and FIG. 4(b) are diagrams illustrating an example of a common parameter.

FIG. 5 is a block diagram schematically illustrating an example of the functional configuration of a common parameter database according to the first embodiment.

FIG. 12 is a block diagram schematically illustrating an example of the configuration of a common parameter database according to a second embodiment.

FIG. 13 is a block diagram schematically illustrating an example of the functional configuration of a common parameter interface in each design tool according to the second embodiment.

FIG. 14 is a diagram illustrating an example of a parameter association table in the control design tool according to the second embodiment.

FIG. 16 is a diagram illustrating an example of the configuration of a cache common parameter table in each design tool.

FIG. 17 is a flowchart illustrating an example of the procedure of a parameter value update process according to the third embodiment.

DESCRIPTION OF EMBODIMENTS

Hereinafter, a common parameter interface generation program and a parameter reading program according to embodiments of the present invention will be described in detail with reference to the accompanying drawings. The present invention is not limited by the embodiments.

First Embodiment

In the following description, a control system arranges control devices, and sequentially performs and establishes a line design process of generating line design information, a mechanical design process of selecting a control device that satisfies a required performance and specifications, on the basis of the line design information, and generating mechanical design information, such as a timing chart, and a control design process of selecting a programming language or a program component, on the basis of the mechanical design information, and generating control design information including a control program and an operation parameter which is a set value controlled by the control program.

Figure 1:
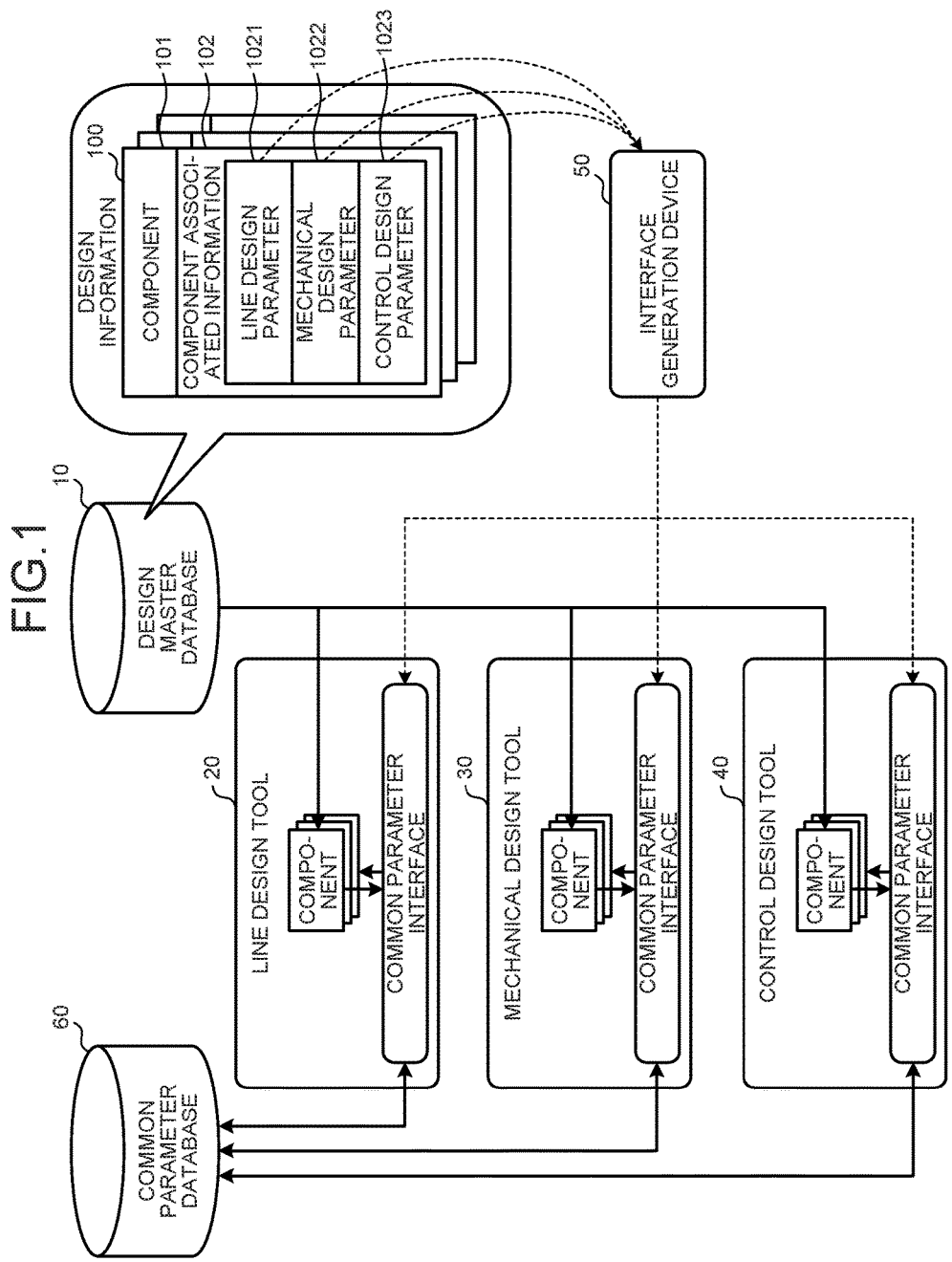
FIG. 1 is a block diagram schematically illustrating the configuration of a control system design support system according to a first embodiment.

FIG. 1 is a block diagram schematically illustrating the configuration of a control system design support system according to the first embodiment. The control system design support system includes a design master database 10, a line design tool 20, a mechanical design tool 30, a control design tool 40, an interface generation device 50, and a common parameter database 60. These components are connected to each other through, for example, a network.

The line design tool 20, the mechanical design tool 30, and the control design tool 40 are configured by an information processing terminal, such as a personal computer, into which a line design application, a mechanical design application, and a control design application are introduced, respectively. These tools may be independently provided in different information processing terminals or an information processing terminal may have the functions of a plurality of design tools.

The design master database 10 stores design information 100 about a control device forming a control system. For example, the design information 100 is provided for each type of control device. A type of control device is used as a component 101 and the components 101 are combined to design the control system. As illustrated in FIG. 1, in the design master database 10, a type of component 101 is associated with component-associated information 102 including a line design parameter 1021 used in the line design, a mechanical design parameter 1022 used in the mechanical design, and a control design parameter 1023 used in the control design. The component 101 is, for example, a three-dimensional computer aided design (3D CAD) component of the control device, specification data of the control device, or a program component for controlling the operation of the control device. The line design parameter 1021 is used to operate the 3D CAD component with, for example, animation. The mechanical design parameter 1022 is used to create a timing chart. The control design parameter 1023 is used to input and output the program component. The line design parameter 1021, the mechanical design parameter 1022, and the control design parameter 1023 have the same meaning but have different formats.

The line design tool 20 is a device which generates line design information, such as the arrangement position of the control device, the distance between the control devices, and the performance required for the control device, on the basis of information input from the user. The line design tool 20 is, for example, a 3D CAD tool. A line designer combines and arranges the components 101 stored in the design master database 10, that is, the 3D CAD components to create the line design information. In addition, the format of data to be used is set by the component-associated information 102 associated with the arranged component 101 and is stored in the line design information.

Figure 2:
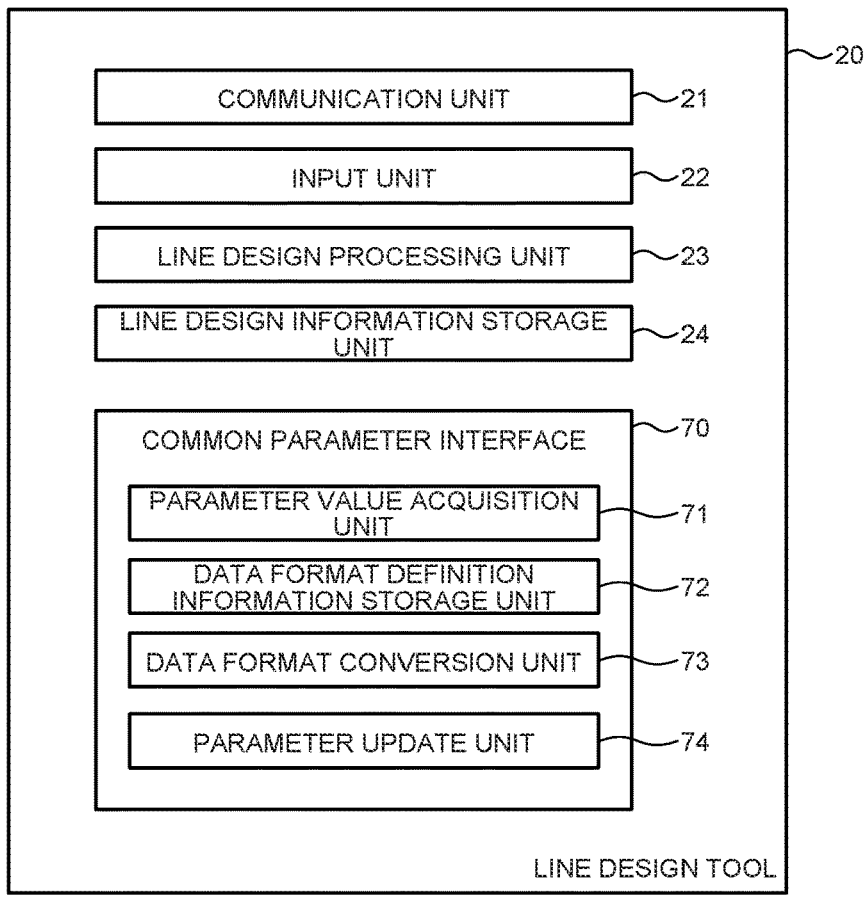
FIG. 2 is a block diagram schematically illustrating an example of the configuration of a line design tool.

FIG. 2 is a block diagram schematically illustrating an example of the configuration of the line design tool. The line design tool 20 includes a communication unit 21, an input unit 22, a line design processing unit 23, a line design information storage unit 24, and a common parameter interface 70.

The communication unit 21 performs communication with other devices through a network. The input unit 22 is an input interface with the user of the line design tool 20 and includes an input device, such as a keyboard, or a pointing device, such as a mouse.

The line design processing unit 23 receives an operation related to the line design from the user and generates or edits the line design information in response to the operation instruction. For example, when the user selects a 3D CAD component in the design master database 10 and issues an arrangement instruction, the 3D CAD component is arranged on the basis of the arrangement instruction and the line design information is generated.

The line design information includes a parameter related to the 3D CAD component, a user-defined parameter name which is defined by the user, the data format of the parameter, and the set value of the parameter. The data format is information indicating whether the data to be used is numerical data or bit data indicating 0 or 1. In addition, when the data to be used is numerical data, the data format is information indicating the bit number of data or information indicating whether the numerical data is an integer. The data format may include, for example, a data length and the number of data, regardless of the type of data.

When the user issues an instruction to generate the line design information, the line design processing unit 23 performs a process of generating new line design information. When the user issues a line design editing instruction, the line design processing unit 23 performs a process of reading the line design information corresponding to the instruction from the line design information storage unit 24. The line design information storage unit 24 stores the line design information generated by the line design processing unit 23.

The common parameter interface 70 is a processing unit that is generated for each control device (component) by the interface generation device 50, which will be described below, and is provided in order to commonly manage the parameters which have the same meaning but have different formats used by each design tool integrally, regardless of the type of design tool. The common parameter interface 70 includes a parameter value acquisition unit 71, a data format definition information storage unit 72, a data format conversion unit 73, and a parameter update unit 74.

The parameter value acquisition unit 71 acquires a value corresponding to the user-defined parameter name related to the component from the common parameter database 60 through the communication unit 21 when the line design processing unit 23 reads the line design information from the line design information storage unit 24.

The data format definition information storage unit 72 stores data format definition information for defining the data format required when the value of the parameter acquired by the parameter value acquisition unit 71 is treated in the line design tool 20.

The data format conversion unit 73 converts the value of the parameter acquired from the common parameter database 60 into a data format defined by the data format definition information in the data format definition information storage unit 72.

When an instruction to change the value of the parameter (user-defined parameter name) defined by the line design information is received, the parameter update unit 74 performs a process of updating the value of the parameter managed by the common parameter database 60.

As such, the common parameter interface 70 relays access to the common parameter to which each design tool mutually refers, and performs conversion into a data format suitable for each design tool, if necessary. In addition, when the common parameter is changed, it is possible to follow the change of the parameter, using an ID and a parameter name provided for each control device, that is, each component. In addition, it is possible to change the common parameter, without affecting the line design information, the mechanical design information, and the control program. Therefore, it is not necessary to change a logic portion of the control program and to change the parameter.

The interface generation device 50 acquires, from the design master database 10, a list of the parameters, whose detailed set values are to be determined in the mechanical design and the control design, for the control device, that is, the component in the line design information generated by the line design tool 20, and generates the common parameter interface 70 (program) for accessing the parameter of the control device for each design tool.

Figure 3:
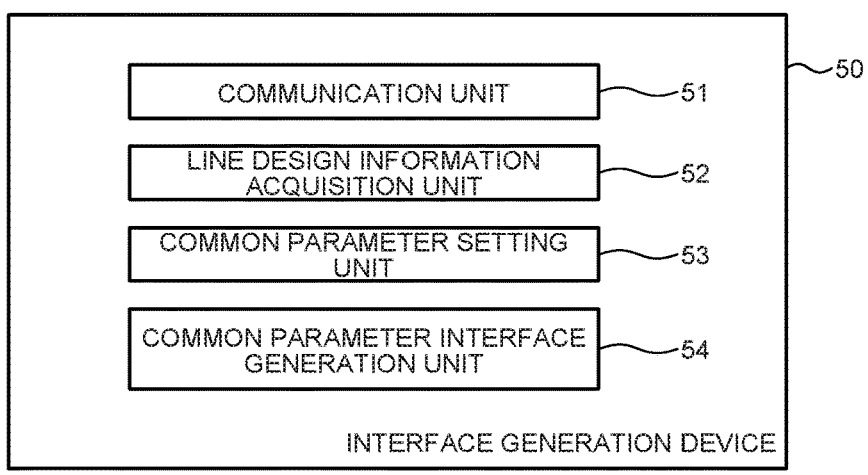
FIG. 3 is a block diagram schematically illustrating an example of the configuration of an interface generation device.

FIG. 3 is a block diagram schematically illustrating an example of the configuration of the interface generation device. The interface generation device 50 includes a communication unit 51, a line design information acquisition unit 52, a common parameter setting unit 53, and a common parameter interface generation unit 54.

The communication unit 51 performs communication with other devices through the network. The line design information acquisition unit 52 acquires the line design information from the line design tool 20.

The common parameter setting unit 53 acquires the control device (component) from the line design information and assigns an ID (identifier) for uniquely identifying the acquired control device. In addition, the common parameter setting unit 53 acquires, for example, the specification data of the acquired control device and the program component from the design master database 10, acquires the parameters whose detailed set values are to be determined in the mechanical design and the control design from among the acquired data, and associates the control device with the ID to generate a common parameter. The generated common parameter is registered as a record of a common parameter table in the common parameter database 60. The common parameter is generated for the control device included in the line design information.

For example, the mechanical design tool 30 creates a timing chart, and the operation time of a subject of the operation, that is, a signal, in the timing chart is acquired as the parameter. In addition, the control design tool 40 creates a control program using a program component, such as a function block, and the value of an input/output signal forming the control program or the program component is acquired as the parameter.

FIG. 4(a) and FIG. 4(b) are diagrams illustrating an example of the common parameter. FIG. 4(a) is a diagram illustrating an example of the function block for generating the common parameter and FIG. 4(b) is a diagram illustrating an example of the common parameter generated from the function block illustrated in FIG. 4(a). As illustrated in FIG. 4(a), the function block is, for example, a program component which moves an arm in two axial directions. When the amounts of movement X and Y and a speed Sp are input, the function block outputs a start signal St at the time of the start of an operation and outputs a completion signal Ed at the time of the completion of the operation. In addition, when an error occurs, the function block outputs an error number Er.

As illustrated in FIG. 4(b), a common parameter table includes an ID for identifying a component, that is, a control device, the name of the component which is used in the line design, the name of the component which is used in the mechanical design, the name of the component which is used in the control design, a parameter name used in the component, and a value. That is, the names of a component which are used in the line design, the mechanical design, and the control design are associated with the parameters of the component. Therefore, it is possible to manage the parameters which are used in common by a plurality of design tools.

In the example illustrated in FIG. 4(b), an arm, which is a component, has an ID "0001", has a name "ΔΔ arm" in the line design, has a name "ΔΔ operation timing" in the mechanical design, and has a name "Function Block 001" in the control design. In addition, parameter names "X", "Y", "Sp", "St", "Ed", and "Er" are set to the arm and values are stored in the parameter names.

When the common parameter setting unit 53 generates the common parameter, the common parameter interface generation unit 54 generates the common parameter interface 70 related to the control device having the common parameter generated for each design tool. The common parameter interface 70 is formed so as to have the same functions as the common parameter interface 70 of the line design tool 20 illustrated in FIG. 2. The common parameter interface generation unit 54 generates the interface on the basis of the data format of the common parameter which the design tools mutually refer to, the length of data, the number of data, and component information associated with the parameter.

The common parameter database 60 unitarily manages the common parameter, which is used in the design information generated in each design tool, outside each design tool. FIG. 5 is a block diagram schematically illustrating an example of the functional configuration of the common parameter database according to the first embodiment. The common parameter database 60 includes a communication unit 61 which performs communication with other devices connected to the network, a common parameter table 62 which is common parameter information storing the common parameter of each control device, a parameter association table 63 that is parameter association information in which the parameter stored in the common parameter table 62 is associated with the user-defined parameter name used in each design tool, and a common parameter change unit 64 which changes the record of the common parameter table 62 in response to a request to change the value of the parameter in the common parameter table 62.

Figure 6:
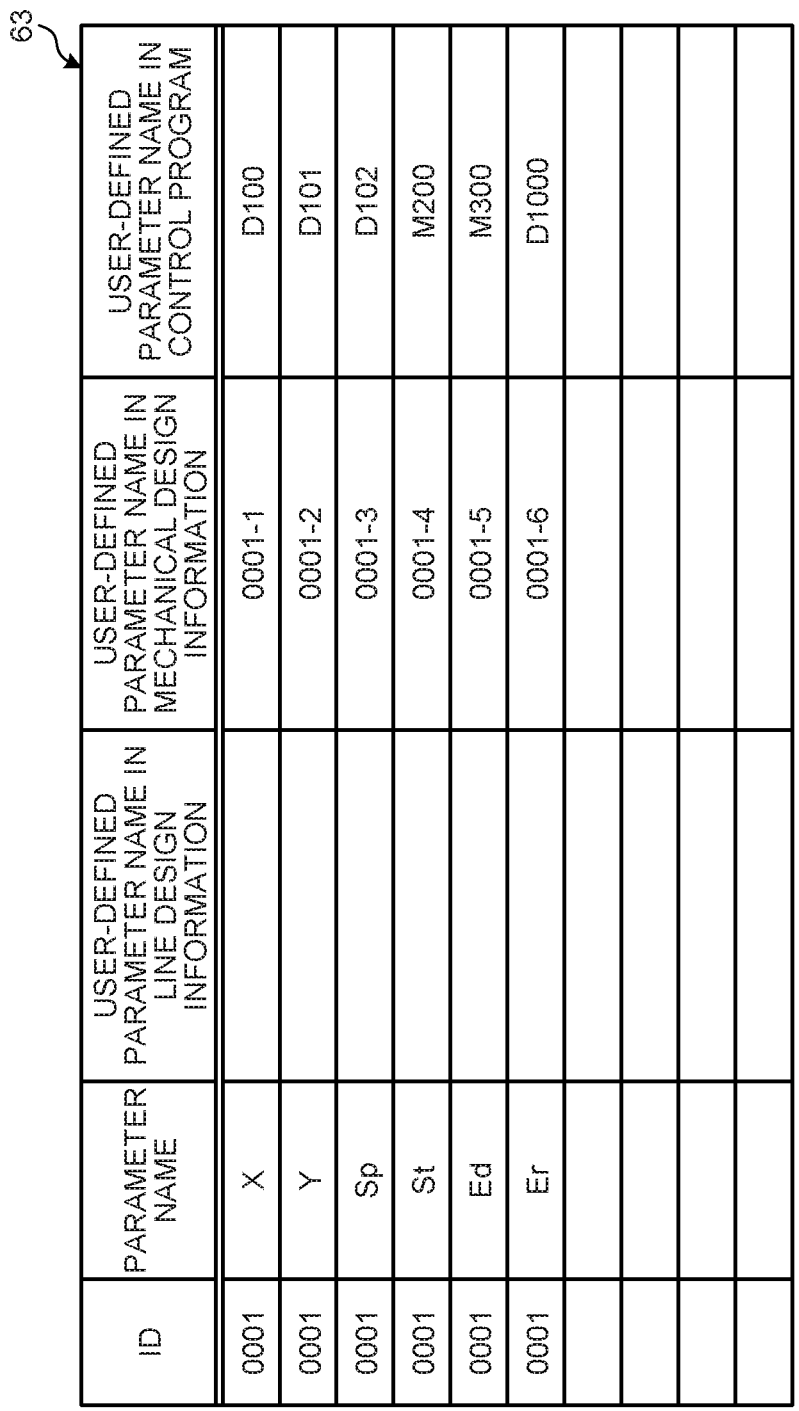
FIG. 6 is a diagram illustrating an example of the configuration of a parameter association table.

The common parameter table 62 has the structure illustrated in FIG. 4(b). As described above, the parameters have the same meaning but have different parameter names in each design tool (each design information item). In addition, the parameters are used in different data formats in each design tool, if necessary. Therefore, in the parameter association table 63, the parameter defined by the common parameter table 62 is associated with the user-defined parameter name used in each design tool (each design information item). FIG. 6 is a diagram illustrating the configuration of the parameter association table. As illustrated in FIG. 6, the parameter association table 63 includes the parameter defined by the common parameter table 62, an ID indicating the control device, that is, the component in which the parameter is used, and a user-defined parameter name which is defined for the parameter in each design tool (each design information item). In this example, the ID, the user-defined parameter name in the line design information, the user-defined parameter name in the mechanical design information, and the user-defined parameter name in the control program are associated with the parameter name in the common parameter table 62. In addition, in this example, the common parameter table 62 and the parameter association table 63 are managed in a table format. However, the present invention is not limited thereto. For example, the common parameter table 62 and the parameter association table 63 may be managed, using a markup language such as an extensible markup language (XML).

Figure 7:
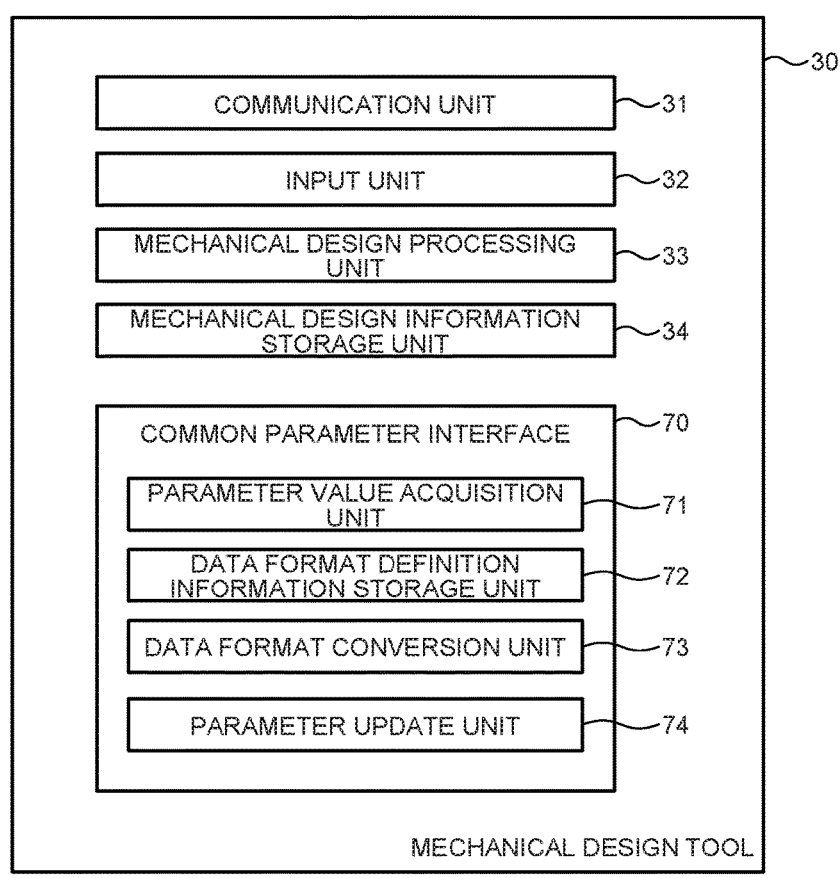
FIG. 7 is a block diagram schematically illustrating an example of the functional configuration of a mechanical design tool.

The mechanical design tool 30 generates mechanical design information, such as a timing chart indicating how to operate, for each control device, on the basis of the line design information and the common parameter, such that the required performance of the line design information is satisfied. FIG. 7 is a block diagram schematically illustrating an example of the functional configuration of the mechanical design tool. The mechanical design tool 30 includes a communication unit 31, an input unit 32, a mechanical design processing unit 33, a mechanical design information storage unit 34, and the common parameter interface 70.

The mechanical design processing unit 33 receives an operation related to the mechanical design from the user and generates or changes mechanical design information in response to the operation instruction. For example, when the user inputs an instruction to create a timing chart indicating the state of the input/output values of the control device, that is, the component from the specification information in the design master database 10, the mechanical design processing unit 33 creates a timing chart on the basis of the instruction. In this case, for example, the mechanical design processing unit 33 sets the parameter so as to fall within the range of the minimum value and the maximum value defined by the specification information. Then, the timing chart is used as the mechanical design information. The mechanical design information storage unit 34 stores the mechanical design information. The communication unit 31, the input unit 32, and the common parameter interface 70 have the same configuration as those described in the line design tool 20 and the description thereof will not be repeated.

Figure 8:
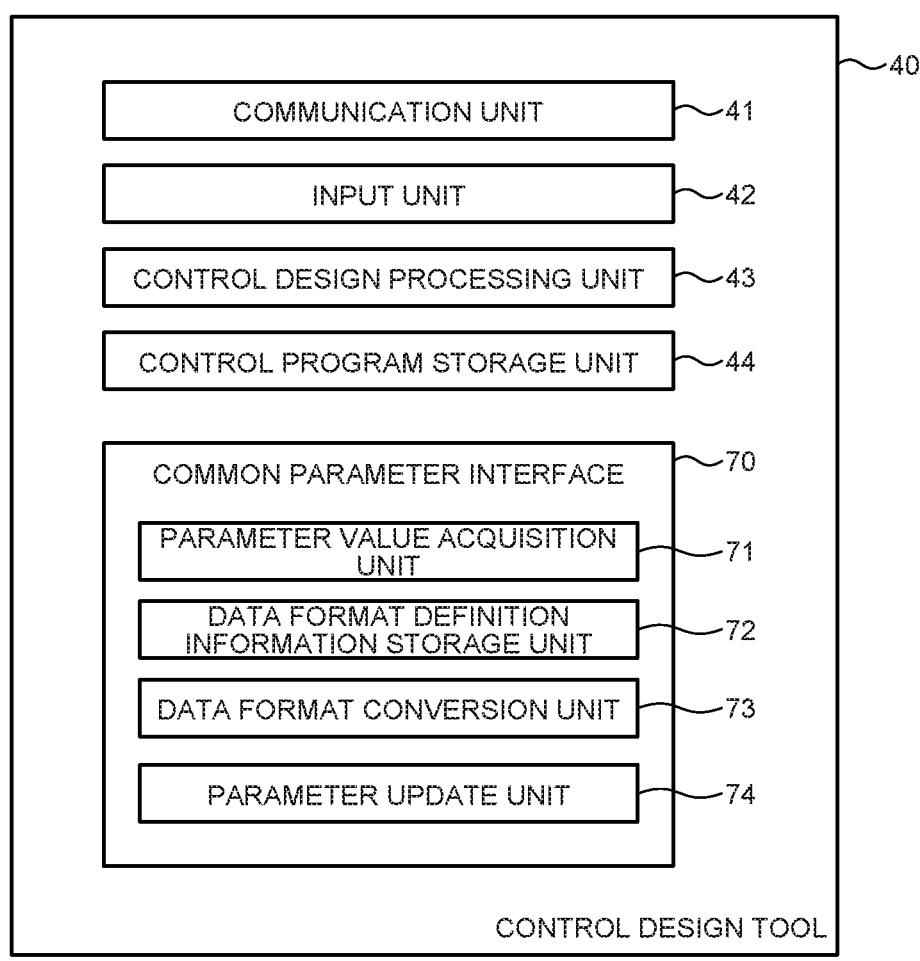
FIG. 8 is a block diagram schematically illustrating an example of the functional configuration of a control design tool.

The control design tool 40 generates or changes operation parameters and a control program, which is the control design information, from the content input by the user, on the basis of the mechanical design information. The control program defines a program executed by the control device. FIG. 8 is a block diagram schematically illustrating an example of the functional configuration of the control design tool. The control design tool 40 includes a communication unit 41, an input unit 42, a control design processing unit 43, a control program storage unit 44, and the common parameter interface 70.

The control design processing unit 43 creates or changes a control program, using a programming language and a program component, on the basis of the mechanical design information and the common parameter, in response to an instruction from the user. For example, when the user inputs an instruction to create a control program using the program component in the design master database 10, the control design processing unit 43 creates a control program on the basis of the instruction. The control program storage unit 44 stores the control program. The communication unit 41, the input unit 42, and the common parameter interface 70 have the same configuration as those described in the line design tool 20 and the description thereof will not be repeated.

Figure 9:
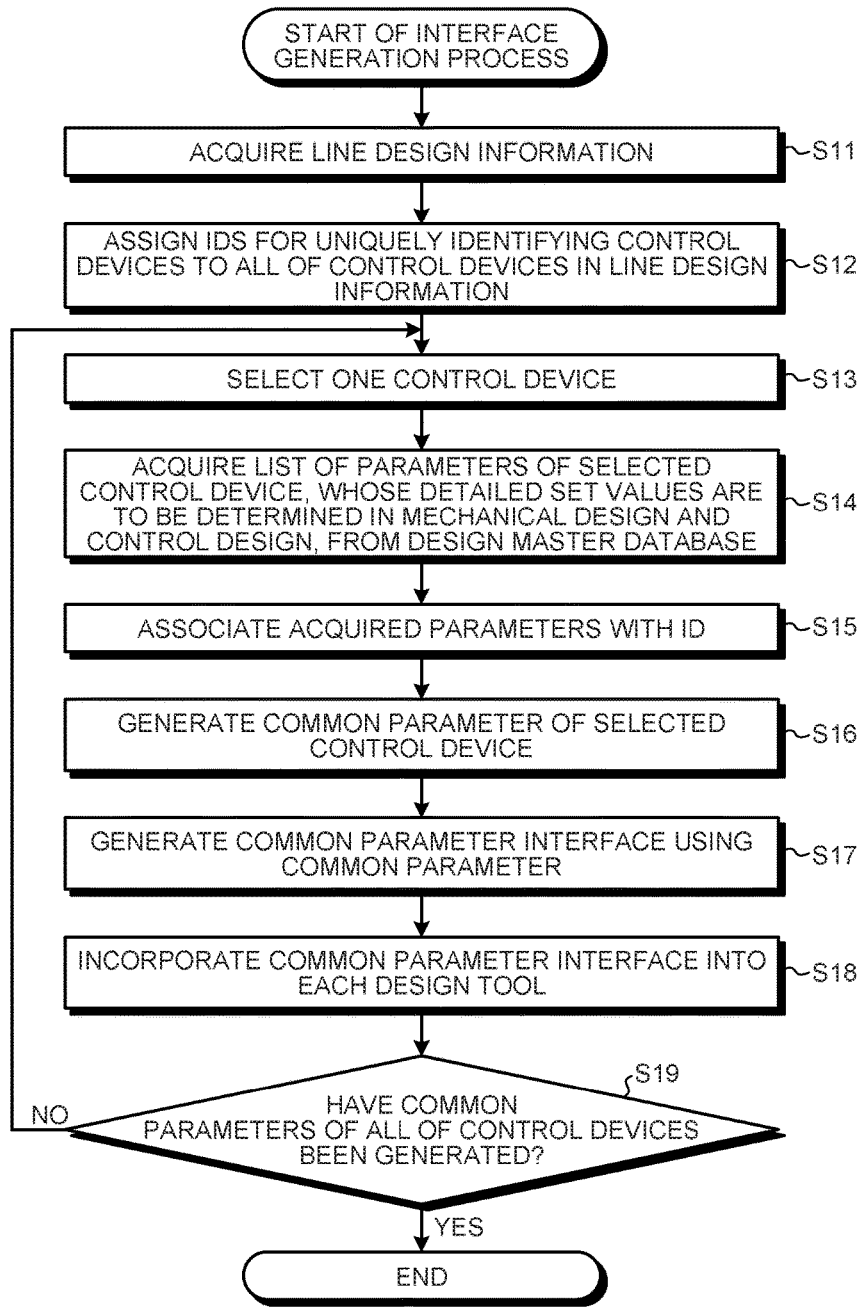
FIG. 9 is a flowchart illustrating an example of the procedure of an interface generation process according to the first embodiment.

Next, the operation of the control system design support system will be described. FIG. 9 is a flowchart illustrating an example of the procedure of an interface generation process according to the first embodiment. Here, it is assumed that the line design information including, for example, the arrangement of the control devices forming the control system and the distance between the control devices has already been generated by the line design tool 20.

First, the line design information acquisition unit 52 of the interface generation device 50 acquires the line design information (Step S11). The line design information is acquired from, for example, the line design tool 20. Then, the common parameter setting unit 53 assigns IDs for uniquely identifying each control device to all of the control devices, that is, the components in the acquired line design information (Step S12). Therefore, it is possible to follow a change in the line design.

Then, the common parameter setting unit 53 selects a control device (Step S13) and acquires a list of the parameters of the control device, whose detailed set values are to be determined in the subsequent mechanical design and control design, from the design master database 10 (Step S14). In addition, the common parameter setting unit 53 associates the acquired parameters with the IDs assigned in Step S12 (Step S15) and generates a common parameter for the selected control device (Step S16).

Then, the common parameter interface generation unit 54 generates the common parameter interface 70 in each design tool, using the generated common parameter (Step S17). The common parameter interface 70 is a program which enables each design tool to perform a process of reading the value associated with the parameter from the common parameter table 62 of the common parameter database 60, a process of converting the data format during the process of reading the value, and a process of changing the value associated with the parameter.

When the common parameter interface 70 is generated, data format definition information for defining the data format, which is required when the common parameter is treated in each design tool, is also generated. For the data format definition information, a data format which is predetermined according to the usage of the control device may be set. For example, a plurality of data formats of a target control device, that is, a target component may be registered in the design master database 10 in advance and a data format may be selected from the plurality of types of data formats by a try and error method. Specifically, during the interface generation process of each design tool, the types of data formats are sequentially transmitted from the design master database 10 to each design tool, and the user sets the selected type of data format. In addition, the set data format is stored as the data format definition information, which makes it possible to smoothly read the parameter with a desired data format in the subsequent processes.

Then, the common parameter interface generation unit 54 incorporates the generated common parameter interface 70 into each design tool (Step S18). For example, the common parameter interface 70 can be incorporated into each design tool by, for example, a plug-in method.

Then, the common parameter setting unit 53 determines whether the common parameter generation process has been performed for all of the control devices, that is, all of the components (Step S19). When the common parameter generation process for all of the control devices has not been completed (No in Step S19), the process returns to Step S13. When the common parameter generation process for all of the control devices has been completed (Yes in Step S19), the process ends.

The parameter association table 63 of the common parameter database 60 is created at the same time as the user generates each design information item using each design tool. For example, the user issues an instruction to have the user-defined parameter name in the line design information be input to the parameter association table in which the ID of the control device, that is, the component and the name of the parameter used by the control device are registered in the line design tool 20. The user issues an instruction to have the user-defined parameter name in the mechanical design information be input to the parameter association table in the mechanical design tool 30. The user issues an instruction to have the user-defined parameter name in the control program be input to the parameter association table in the control design tool 40. Then, the content of them is sequentially registered and the content of the parameter association table is updated.

Figure 10:
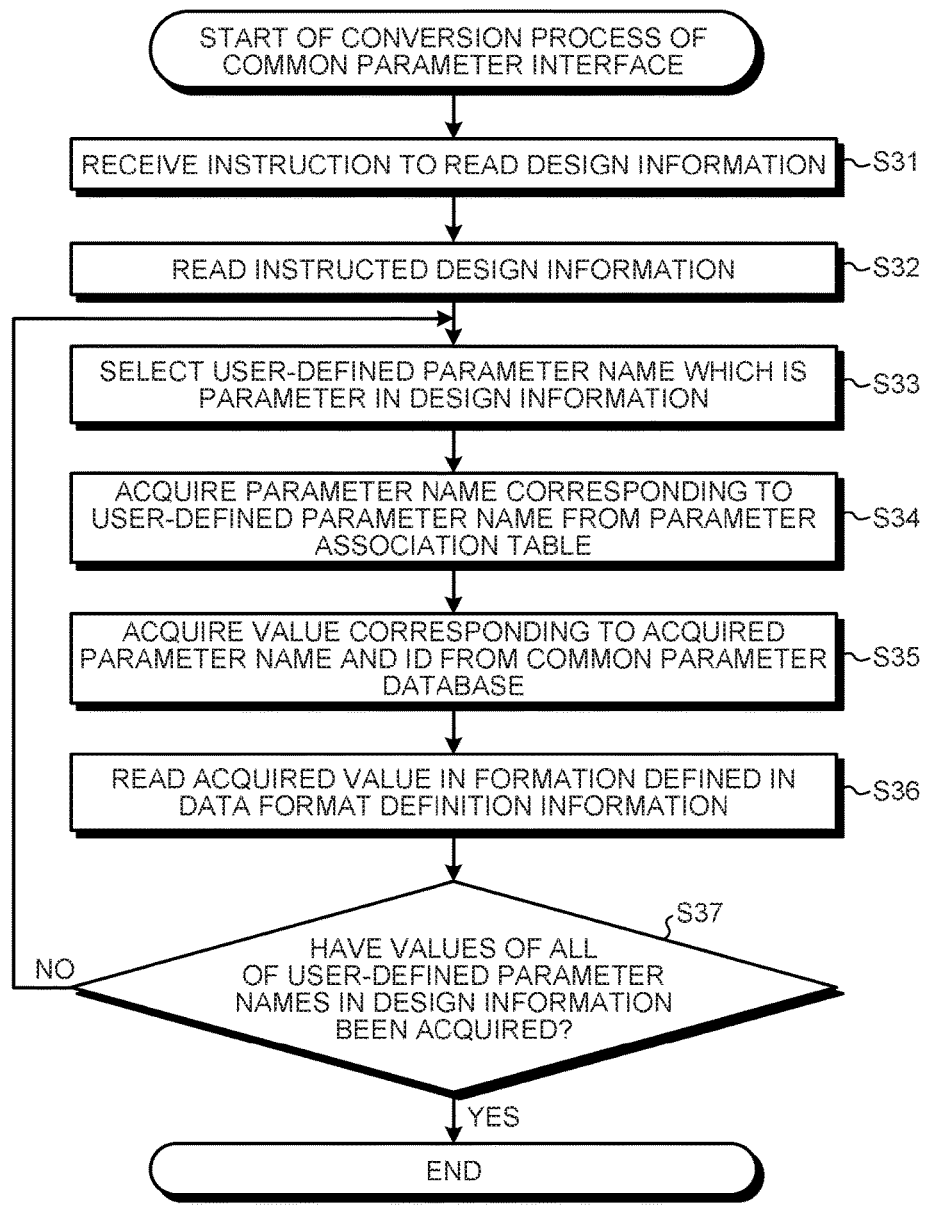
FIG. 10 is a flowchart illustrating a conversion process of a common parameter interface according to the first embodiment.

Next, the conversion process and the parameter value update process of the common parameter interface 70 will be described. FIG. 10 is a flowchart illustrating the conversion process of the common parameter interface according to the first embodiment. As described above, it is assumed that the common parameter table 62 and the parameter association table 63 are stored in the common parameter database 60.

First, when an instruction to read design information is received from the user of the design tool (Step S31), the design tool reads the instructed design information (Step S32). The line design tool 20 reads the line design information. The mechanical design tool 30 reads the mechanical design information. The control design tool 40 reads the control program.

Then, the parameter value acquisition unit 71 of the common parameter interface 70 selects the user-defined parameter name which is a parameter in the design information (Step S33), and acquires a parameter name corresponding to the acquired user-defined parameter name from the parameter association table 63 of the common parameter database 60 (Step S34). In addition, the parameter value acquisition unit 71 acquires a value corresponding to a combination of the acquired parameter name and the ID of a target control device from the common parameter database 60 (Step S35).

Then, the data format conversion unit 73 reads the acquired value of the parameter in the format defined by the data format definition information in the data format definition information storage unit 72 (Step S36). Then, the parameter value acquisition unit 71 determines whether the values of all of the user-defined parameter names in the design information have been acquired (Step S37). When the values of all of the user-defined parameter names in the design information have not been acquired (No in Step S37), the process returns to Step S33. When the values of all of the user-defined parameter names in the design information have been acquired (Yes in Step S37), the process ends.

Figure 11:
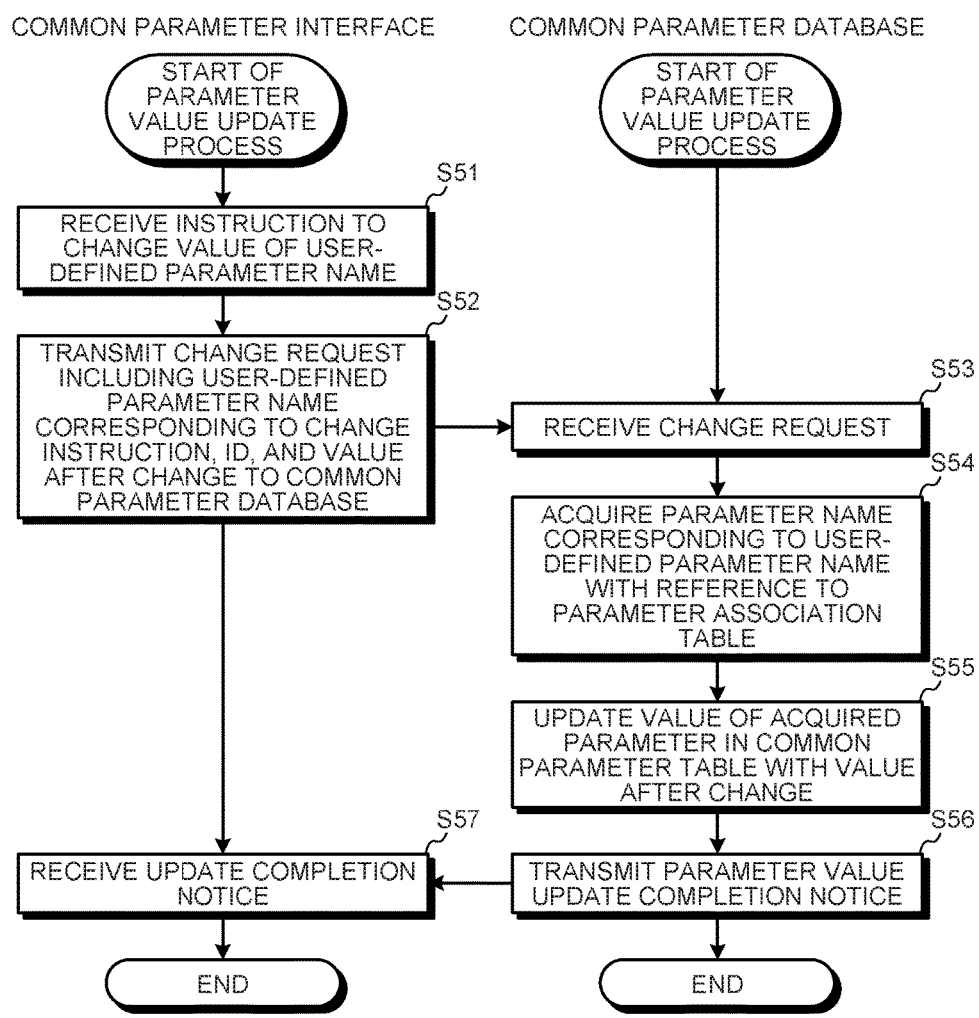
FIG. 11 is a flowchart illustrating an example of the procedure of a parameter value update process according to the first embodiment.

FIG. 11 is a flowchart illustrating an example of the procedure of the parameter value update process according to the first embodiment. First, when the user inputs an instruction to change the value of the user-defined parameter name used in the design information through the input unit of each design tool (Step S51), the parameter update unit 74 of the common parameter interface 70 transmits a change request including the user-defined parameter name having been instructed to be changed, the ID associated with the user-defined parameter name, and the value of the user-defined parameter name, that is, a value after change to the common parameter database 60 through the communication unit (Step S52).

Then, when the change request is received (Step S53), the common parameter change unit 64 of the common parameter database 60 acquires the parameter name corresponding to the user-defined parameter name, with reference to the parameter association table 63 (Step S54). Then, the common parameter change unit 64 updates the value of the acquired parameter name in the common parameter table 62 with the value stored in the change request (Step S55). Then, the common parameter change unit 64 transmits a parameter update completion notice to the design tool which has transmitted the change request (Step S56). In addition, the design tool receives the update completion notice from the common parameter database 60 (Step S57) and ends the parameter update process.

As illustrated in FIG. 10, whenever reading each design information item, each design tool acquires the value of the user-defined parameter name from the common parameter database 60. Therefore, even when the parameter is changed by any one of the design tools, it is possible to display each design information item using the updated parameter in the design information to be read later.

A screen showing that each design tool acquires the value of the user-defined parameter name from the common parameter database 60 and converts the format of the acquired data may be displayed on a display unit (not illustrated) and may be presented to the user.

In the first embodiment, in the control system design support system including the line design tool 20, the mechanical design tool 30, the control design tool 40, the design master database 10, the interface generation device 50, and the common parameter database 60, when the line design tool 20 generates the line design information for determining, for example, the arrangement of the control devices, the interface generation device 50 generates the common parameter database 60 which manages the formats and the values of the parameters used by each control device, on the basis of the line design information. Subsequently, the interface generation device 50 generates the common parameter interface 70 of each design tool, on the basis of the common parameter database 60, and incorporates the common parameter interface 70 into each design tool. In addition, while the user is generating the design information with each design tool, the interface generation device 50 generates the parameter association table 63 in which the parameter is associated with the user-defined parameter name. Therefore, when each design tool reads each design information item, it is possible to acquire a value corresponding to the user-defined parameter name included in the design information from the common parameter database 60, to convert the value into a data format which can be used by each design tool, and to display the value. When the value of the parameter is changed by any one of the design tools, the changed value of the parameter is reflected in the common parameter database 60. Therefore, the persons in change of other design tools do not need to perform the process of changing the value of the parameter, and it is possible to open the read design information with the changed parameter.

Second Embodiment

In the first embodiment, the parameter association table is stored in the common parameter database. In a second embodiment, a case in which the parameter association table is provided in each design tool will be described.

FIG. 12 is a block diagram schematically illustrating an example of the configuration of a common parameter database according to the second embodiment and FIG. 13 is a block diagram schematically illustrating an example of the functional configuration of a common parameter interface of each design tool according to the second embodiment. A control system design support system according to the second embodiment has the same basic configuration as that according to the first embodiment. However, the control system design support system according to the second embodiment differs from the control system design support system according to the first embodiment in that a parameter association table 75 is not included in a common parameter database 60, but is included in a common parameter interface 70 of each of a line design tool 20, a mechanical design tool 30, and a control design tool 40, as described above.

FIG. 14 is a diagram illustrating an example of the parameter association table in the control design tool according to the second embodiment. In the parameter association table 75, an ID for identifying a control device, a parameter name which is used by the control device, and a user-defined parameter name which is used in design information generated by the design tool are associated with each other. Since each design tool does not use the user-defined parameter name used in the design information of other design tools, the user-defined parameter name which is used in the design information of the host design tool may be associated with the parameter. Therefore, in the parameter association table 75 illustrated in FIG. 14, only the user-defined parameter name used in the control program is associated with the parameter.

The operation process of the control system design support system is similar to that according to the first embodiment except that the common parameter interface 70 in each design tool performs a process of acquiring a parameter corresponding to a user-defined parameter. Therefore, the description of the process will not be repeated.

According to the second embodiment, it is possible to obtain the same effect as that in the first embodiment.

Third Embodiment

In the above-described embodiments, the common parameter table is provided in the common parameter database and the design tool accesses the common parameter database whenever reading the common parameter. However, in a third embodiment, a case in which each design tool temporarily stores the common parameter table acquired from the common parameter database and performs, for example, a process of reading design information using the temporarily stored common parameter table will be described.

Figure 15:
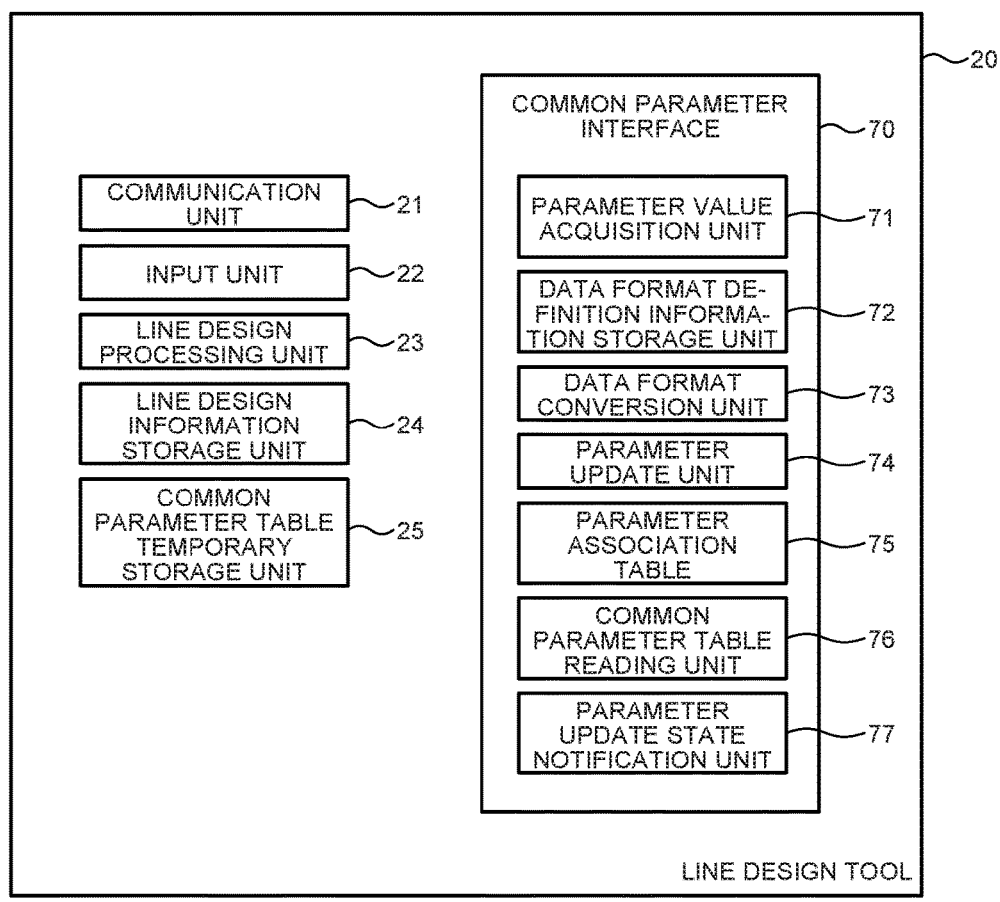
FIG. 15 is a block diagram schematically illustrating an example of the functional configuration of a line design tool according to a third embodiment.

The control system design support system according to the third embodiment has the same basic configuration as that according to the first embodiment except for the configuration of each design tool. Here, it is assumed that a parameter association table is not provided in a common parameter database 60, but is provided in a common parameter interface 70 of each design tool as in the second embodiment. FIG. 15 is a block diagram schematically illustrating an example of the functional configuration of a line design tool according to the third embodiment. A line design tool 20 includes a communication unit 21, an input unit 22, a line design processing unit 23, a line design information storage unit 24, a common parameter table temporary storage unit 25, and the common parameter interface 70.

The common parameter table temporary storage unit 25 temporarily stores a common parameter table 62 acquired from the common parameter database 60. Hereinafter, the common parameter table stored in the common parameter table temporary storage unit 25 is referred to as a cache common parameter table.

FIG. 16 is a diagram illustrating an example of the configuration of the cache common parameter table in each design tool. The cache common parameter table includes a valid state indicating the validity or invalidity of each parameter and an update necessary/unnecessary state indicating whether the update of each parameter in the common parameter database 60 is required, in addition to the items of the common parameter table 62 illustrated in FIG. 4.

The valid state of the parameter means a state in which the parameters have the same value in the cache common parameter tables of all of the design tools. The invalid state of the parameter means a state in which the parameters in one or more cache common parameter tables have different values among the cache common parameter tables of all of the design tools. This state means, for example, a state in which a parameter update process is performed in any of the design tools. Immediately after the common parameter table 62 of the common parameter database 60 is read to each design tool, all of the parameters are valid. In addition, the valid or invalid state of the parameter can be indicated by, for example, a flag.

The update necessary/unnecessary state of the parameter indicates whether the update of the content of the parameter in the common parameter database 60 is required. The parameter which has been updated in the host design tool is in an "update necessary state" indicating that the parameter needs to be reflected in the common parameter table 62 of the common parameter database 60. In contrast, the parameter which has not been updated in the host design tool (including a case in which the content of update in other design tools is reflected) is in an "update unnecessary state".

The common parameter interface 70 includes a parameter value acquisition unit 71, a data format definition information storage unit 72, a data format conversion unit 73, a parameter update unit 74, a parameter association table 75, a common parameter table reading unit 76, and a parameter update state notification unit 77.

For example, when the design tool reads the design information and an instruction to read the parameter in the design information is issued with the reading of the design information, the parameter value acquisition unit 71 acquires the value of the parameter from the cache common parameter table in the common parameter table temporary storage unit 25. In this case, when the valid state of the read parameter is "valid", the parameter value acquisition unit 71 acquires the value of the parameter from the cache common parameter table, without any change. When the valid state of the read parameter is "invalid", the parameter value acquisition unit 71 inquires the latest data of the parameter from other design tools and acquires the latest data. Then, the parameter value acquisition unit 71 updates the value of the parameter in the cache common parameter with the acquired latest data.

The data format conversion unit 73 performs the same process as that according to the first embodiment. However, the process of the data format conversion unit 73 is different from that according to the first embodiment in that the data format conversion unit 73 refers to the cache common parameter table stored in the common parameter table temporary storage unit 25.

When a parameter update instruction is received, the parameter update unit 74 performs an update process for the cache common parameter table stored in the common parameter table temporary storage unit 25. When the cache common parameter table is deleted from the common parameter table temporary storage unit 25, the value of the parameter which is in the "update necessary state" in the cache common parameter table is reflected in the common parameter table 62 of the common parameter database 60.

As described in the second embodiment, in the parameter association table 75, the parameter which is used in the common parameter table is associated with the user-defined parameter name which is used in the host design tool.

For example, when the design tool starts or when the common parameter interface 70 is incorporated into the design tool first, the common parameter table reading unit 76 reads the common parameter table 62 from the common parameter database 60 and stores the common parameter table 62 in the common parameter table temporary storage unit 25.

When the parameter update unit 74 updates the parameter in the cache common parameter table, the parameter update state notification unit 77 sets the valid state of the parameter to "valid" and sets the update necessary/unnecessary state to "update necessary". In addition, the parameter update state notification unit 77 notifies parameter invalidity notification information indicating that the values of the cache common parameter tables stored in the common parameter table temporary storage units 25 of other design tools are not used for the updated parameter. In addition, when the parameter invalidity notification information is received from other design tools, the parameter update state notification unit 77 sets the valid state of the corresponding parameter to "invalid". However, in this example, the update necessary/ unnecessary state is maintained at the value at that time.

Since the other configurations are the same as those in the first embodiment, the description thereof will not be repeated. Here, the configuration of the line design tool 20 has been described. The mechanical design tool 30 and the control design tool have the same configuration as described above.

Next, a process of updating the parameter stored in the common parameter table temporary storage unit 25 will be described. FIG. 17 is a flowchart illustrating an example of the procedure of a parameter value update process according to the third embodiment. First, when the user inputs an instruction to change the value of the user-defined parameter name used in the design information or the program through the input unit of each design tool (Step S71), the parameter update unit 74 of the common parameter interface 70 acquires the parameter corresponding to the user-defined parameter name of the control device, which has been instructed to be changed, from the parameter association table 75 (Step S72).

Then, the parameter update unit 74 updates the value of the parameter of the control device in the cache common parameter table of the common parameter table temporary storage unit 25, which has been acquired in Step S72, with the value instructed by the user (Step S73). In addition, the parameter update state notification unit 77 sets the valid state of the corresponding parameter to "valid" and sets the update necessary/unnecessary state to "update necessary" (Step S74).

Then, the parameter update state notification unit 77 transmits the parameter invalidity notification information to other design tools such that the valid state of the updated parameter is set to "invalid" (Step S75). Other design tools set the valid states of the corresponding parameters in the cache common parameter tables of their common parameter table temporary storage units 25 to "invalid" on the basis of the parameter invalidity notification information. Then, the parameter update process ends.

Figure 18:
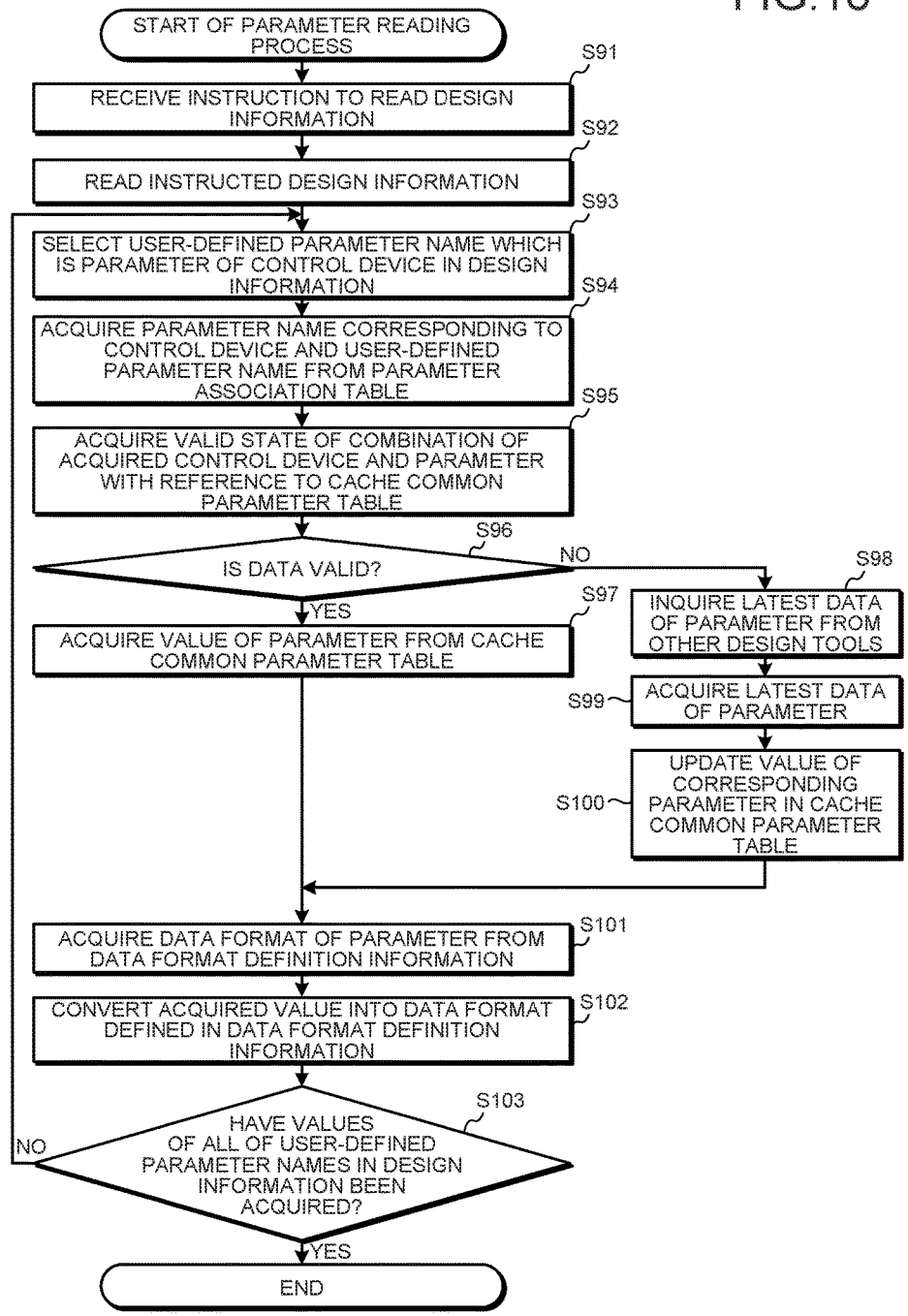
FIG. 18 is a flowchart illustrating an example of the procedure of a parameter reading process according to the third embodiment.

FIG. 18 is a flowchart illustrating an example of the procedure of a parameter reading process according to the third embodiment. Similarly to Steps S31 to S34 illustrated in FIG. 10 in the first embodiment, when an instruction to read design information is received from the user of the design tool, the design tool reads the instructed design information, selects a user-defined parameter name, which is a parameter of a control device in the design information, and acquires the parameter name corresponding to the acquired control device (ID) and the user-defined parameter name from the parameter association table 75 (Steps S91 to S94).

Then, the parameter value acquisition unit 71 of the common parameter interface 70 acquires the valid state of data for a combination of the acquired control device and parameter, with reference to the cache common parameter table of the common parameter table temporary storage unit 25 (Step S95) and determines whether the data is valid (Step S96). When the data is valid (Yes in Step S96), the parameter value acquisition unit 71 acquires the value of the parameter from the cache common parameter table (Step S97).

On the other hand, when the data is not valid, that is, when the data is invalid (No in Step S96), the parameter value acquisition unit 71 inquires the latest data of the parameter of a target control device from other design tools (Step S98) and acquires the latest data of the parameter (Step S99). Then, the parameter value acquisition unit 71 updates the value of the corresponding parameter in the cache common parameter table of the common parameter table temporary storage unit 25 with the acquired latest data (Step S100).

After Step S100 or Step S97, the data format conversion unit 73 acquires the data format of the parameter of a target control device from the data format definition information of the data format definition information storage unit 72 (Step S101). Then, the data format conversion unit 73 converts the acquired value of the parameter into a designated data format (Step S102). In this way, the parameter in the design information is read in the designated data format.

Then, it is determined whether the values of all of the user-defined parameter names in the design information have been acquired (Step S103). When the values of all of the user-defined parameter names in the design information have not been acquired (No in Step S103), the process returns to Step S93. When the values of all of the user-defined parameter names in the design information have been acquired (Yes in Step S103), the process ends.

Figure 19:
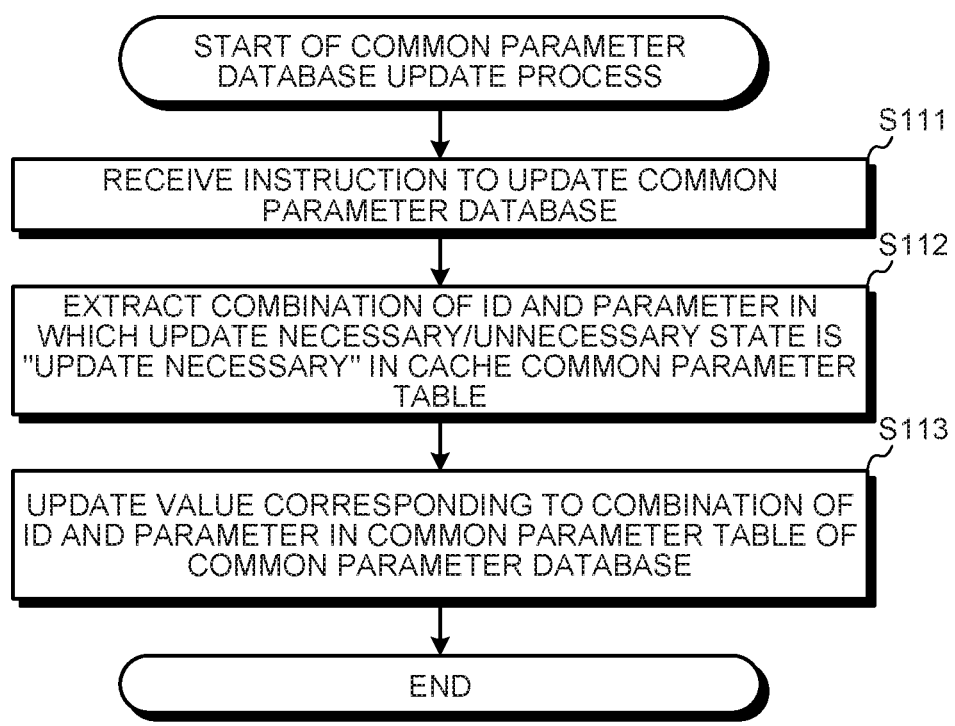
FIG. 19 is a flowchart illustrating an example of the procedure of a common parameter database update method according to the third embodiment.

FIG. 19 is a flowchart illustrating an example of the procedure of a common parameter database update method according to the third embodiment. First, when receiving an instruction to delete the cache common parameter table in the common parameter table temporary storage unit 25 of the design tool or an instruction to update the common parameter database 60, such as an instruction to reflect the content of the cache common parameter table in the common parameter database 60 (Step S111), the parameter update unit 74 extracts a record (a combination of the ID, that is, the control device and the parameter) in which the update necessary/unnecessary state is set to "update necessary" in the cache common parameter table (Step S112).

Then, the parameter update unit 74 updates a value corresponding to the combination of the ID and the parameter in the common parameter table 62 of the common parameter database 60 with the value registered in the cache common parameter table (Step S113). In this case, the common parameter change unit 64 of the common parameter database 60 updates the values in the common parameter table 62 on the basis of an update request from the common parameter interface 70. Then, the process of updating the common parameter database 60 ends.

In the third embodiment, each design tool temporarily stores the common parameter table 62 of the common parameter database 60 and the common parameter interface 70 performs the conversion process and the update process, using the stored common parameter table 62. Therefore, whenever the conversion process and the update process are performed, it is not necessary to access the common parameter database 60 connected to the network and to smoothly perform the conversion process and the update process.

When the parameter is updated, the common parameter table 62 of the host design tool is updated and the parameters of other design tools are updated. Then, it is notified that the values stored in other design tools are valid. When the parameter is updated in a given design tool and the parameter reading process is performed in other design tools, a request to acquire the latest data of the parameter is transmitted to other design tools. Therefore, when the parameter is updated in a given design tool and the parameter reading process is performed in other design tools, there is no concern that the parameter before update will be read in other design tools. Even when the common parameter table 62 is distributed to each design tool, it is possible to synchronize data.

In the above-described embodiments, the common parameter table 62 is described as a database. However, when the common parameter interface 70 knows an access unit to the common parameter table 62, the common parameter table 62 may not be a database management system such as a relational database.

The processes in the interface generation device 50, the common parameter database 60, and the common parameter interface 70 may be implemented by a program which stores the procedure of the process. The program may be executed in the above-mentioned personal computer or an information processing terminal, such as a tablet terminal, to implement the processes. The program is recorded on a computer-readable recording medium, such as a hard disk, a solid state drive (SSD), a floppy (registered trademark) disk, a compact disk (CD)-ROM, a magneto-optical disk (MO), or a digital versatile disk or a digital video disk (DVD). The program may be distributed through a network, such as the Internet, that is, a communication line.

INDUSTRIAL APPLICABILITY

As described above, the control system design support system according to the present invention is useful to design a control system which is a combination of a plurality of control devices.

REFERENCE SIGNS LIST 10 design master database, 20 line design tool, 21, 31, 41, 51, 61 communication unit, 22, 32, 42 input unit, 23 line design processing unit, 24 line design information storage unit, 25 common parameter table temporary storage unit, 30 mechanical design tool, 33 mechanical design processing unit, 34 mechanical design information storage unit, 40 control design tool, 43 control design processing unit, 44 control program storage unit, 50 interface generation device, 52 line design information acquisition unit, 53 common parameter setting unit, 54 common parameter interface generation unit, 60 common parameter database, 62 common parameter table, 63, 75 parameter association table, 64 common parameter change unit, 70 common parameter interface, 71 parameter value acquisition unit, 72 data format definition information storage unit, 73 data format conversion unit, 74 parameter update unit, 76 common parameter table reading unit, 77 parameter update state notification unit

The invention claimed is:

1. A non-transitory computer readable medium containing instructions of a common parameter interface generation program, which generates a common parameter interface in a line design tool which generates line design information of a control system having models of control devices arranged therein, a mechanical design tool which selects a control device on the basis of the line design information and generates mechanical design information, and a control design tool which generates control design information of a mechanical operation on the basis of the mechanical design information, that, when executed by a computer, cause the computer to perform:

assigning identification information for identifying the control device in the line design information;

acquiring a list of parameters of the selected control device, which are used in the mechanical design information and the control design information, from a design information storage unit;

associating the acquired list of the parameters with the identification information and names of the selected control device in each of the line design information, the mechanical design information, and the control design information to generate a common parameter and registering the common parameter in a common parameter storage unit that stores a parameter used in common by the line design tool, the mechanical design tool and the control design tool, the names of the selected control device being different from each other in the line design information, the mechanical design information, and the control design information; and generating, in each of the line design tool, the mechanical design tool, and the control design tool, a common parameter interface that acquires a value of one of the parameters of the selected control device from the common parameter storage unit when one of the line design information, the mechanical design information, and the control design information is read and reads out the value of the parameter to the one of the line design information, the mechanical design information, and the control design information in a data format in data format definition information which defines the data format required when the parameter is treated in the line design tool, the mechanical design tool, and the control design tool, wherein the line design tool, the mechanical design tool, and the control design tool use different data formats from each other to treat the parameter, and the generating further comprises converting the data format to one of the different data formats based on the data format definition information.

2. A non-transitory computer readable medium containing instructions of a parameter reading program, which is used in each design tool of a control system design support system including a line design tool which generates line design information of a control system having models of control devices arranged therein, a mechanical design tool which selects a control device on the basis of the line design information and generates mechanical design information, a control design tool which generates control design information of a mechanical operation on the basis of the mechanical design information, and a common parameter storage unit which stores common parameter information in which a parameter name and a value are associated with each other for a parameter used in common by each of the line design tool, the mechanical design tool, and the control design tool, that, when executed by a computer, cause the computer to perform:

acquiring the parameter name corresponding to a user-defined parameter name of the control device which is defined in one of the line design information, the mechanical design information, and the control design information from parameter association information in which the parameter name and the user-defined parameter name are associated with each other and acquiring a value which is associated with the parameter name from the common parameter information when one of the line design information, the mechanical design information, and the control design information is read, the control device having different user-defined parameter names in the line design information, the mechanical design information, and the control design information; and reading the acquired value of the parameter in a format defined by data format definition information which defines a data format required when the parameter is treated in the line design tool, the mechanical design tool, and the control design tool, wherein the line design tool, the mechanical design tool, and the control design tool use different data formats from each other to treat the parameter, and the reading further comprises converting the data format to one of the different data formats based on the data format definition information.

3. The non-transitory computer readable medium according to claim 2, wherein the acquiring includes:

selecting a user-defined parameter name of the control device which is defined in one of the line design information, the mechanical design information, and the control design information when the one of the line design information, the mechanical design information, and the control design information is read;

acquiring a parameter name corresponding to the user-defined parameter name of the selected control device, from parameter association information in which the parameter name and the user-defined parameter name are associated with each other for each of the control devices; and acquiring a value which is associated with the control device and the acquired parameter name, from common parameter information in the common parameter storage unit.

4. The non-transitory computer readable medium according to claim 3, wherein the instructions cause the computer to further perform updating, when an instruction to change a value of the user-defined parameter name is received, a value in the common parameter information, which is associated with the user-defined parameter name of the control device corresponding to the change instruction, to the value of the parameter corresponding to the change instruction.

5. A non-transitory computer readable medium containing instructions of a parameter reading program, which is used in each design tool of a control system design support system including a line design tool which generates line design information of a control system having models of control devices arranged therein, a mechanical design tool which selects a control device on the basis of the line design information and generates mechanical design information, a control design tool which generates control design information of a mechanical operation on the basis of the mechanical design information, and a common parameter storage unit which stores a parameter used in common by each of the line design information, the mechanical design information, and the control design information, that, when executed by a computer, cause the computer to perform:

acquiring common parameter information in which the control device, a name of the parameter, and a value of the parameter are associated with each other, from the common parameter storage unit, and temporarily storing the common parameter information as cache common parameter information;

acquiring the value of the parameter of the control device which is defined in one of the line design information, the mechanical design information, and the control design information from the cache common parameter information, when the one of the line design information, the mechanical design information, and the control design information is read; and reading the acquired value of the parameter in a format defined by data format definition information which defines a data format required when the parameter is treated in the line design tool, the mechanical design tool, and the control design tool, wherein, the acquiring of the common parameter information comprises associating the control device, the parameter name, the value of the parameter, and a valid state indicating validity or invalidity of a value of each parameter with each other and temporarily storing the common parameter information as the cache common parameter information, and the acquiring of the value of the parameter comprises changing a source from which the value of the parameter is acquired in accordance with the valid state.

6. The non-transitory computer readable medium according to claim 5, wherein, the acquiring of the value of the parameter comprises, when the valid state which is associated with the combination of the control device and the parameter is valid, acquiring the value of the parameter from the cache common parameter information.

7. The non-transitory computer readable medium according to claim 6, wherein the acquiring of the value of the parameter includes:

selecting a user-defined parameter name of the control device which is defined in the design information when the design information is read;

acquiring a parameter name corresponding to the user-defined parameter name of the selected control device, from parameter association information in which the parameter name in the common parameter information temporarily stored and the user-defined parameter name are associated with each other for each of the control devices;

checking whether the valid state associated with the control device and the acquired parameter name is valid; and acquiring a value which is associated with the control device and the acquired parameter name, from the cache common parameter information, when the valid state is valid.

8. The non-transitory computer readable medium according to claim 7, wherein the acquiring of the value of the parameter further includes acquiring a value associated with the control device in which the valid state is valid and the acquired parameter name from the cache common parameter information of other design tools when the valid state is invalid.

9. The non-transitory computer readable medium according to claim 7, wherein the instructions cause the computer to further perform:

updating, when an instruction to change a value of the user-defined parameter name is received, a value in the cache common parameter information, which is associated with the user-defined parameter name of the control device corresponding to the change instruction, to the value of the parameter corresponding to the change instruction; and notifying other design tools of invalidity notification information for invalidating the updated value of the parameter in the cache common parameter information of other design tools.

10. The non-transitory computer readable medium according to claim 9, wherein, the updating further comprises associating an update necessary/unnecessary state indicating whether the update of a corresponding value in the common parameter storage unit among the updated values of the parameters is necessary with the combination of the parameter name, the control device, and the value of the parameter in the cache common parameter information, and the instructions cause the computer to further perform updating of a corresponding value in the common parameter storage unit with the value of the parameter in which the update necessary/unnecessary state in the cache common parameter information is an update necessary state.

* * * * *